(12) United States Patent
Bauer et al.

(10) Patent No.: US 7,447,977 B2
(45) Date of Patent: Nov. 4, 2008

(54) METHOD AND SYSTEM FOR OPTIMIZING FORWARD ERROR CORRECTION OF MULTIMEDIA STREAMING OVER WIRELESS NETWORKS

(75) Inventors: Claus Bauer, San Francisco, CA (US); Wenyu Jiang, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 562 days.

(21) Appl. No.: 11/174,005

(22) Filed: Jun. 30, 2005

(65) Prior Publication Data

US 2007/0022361 A1    Jan. 25, 2007

(51) Int. Cl.
    *H03M 13/35*    (2006.01)
(52) U.S. Cl. ....................... 714/774; 714/776
(58) Field of Classification Search ............. 714/774, 714/776
    See application file for complete search history.

(56) References Cited

U.S. PATENT DOCUMENTS

| | | | | |
|---|---|---|---|---|
| 5,699,369 | A * | 12/1997 | Guha ..................... | 714/774 |
| 6,278,716 | B1 * | 8/2001 | Rubenstein et al. ......... | 370/432 |
| 6,421,387 | B1 * | 7/2002 | Rhee ..................... | 375/240.27 |
| 6,678,267 | B1 * | 1/2004 | Anandakumar et al. ..... | 370/356 |
| 6,728,921 | B1 * | 4/2004 | Bentall et al. .............. | 714/758 |
| 6,868,083 | B2 * | 3/2005 | Apostolopoulos et al. ... | 370/392 |
| 6,891,799 | B1 * | 5/2005 | Hagai et al. ............... | 370/235 |

OTHER PUBLICATIONS

Bauer, et al. "Optimal choice of FEC parameters to protect against queueing losses in wireless networks," 2005 13th IEEE International Conference On Networks, 7th IEEE Malaysia International Conference On Communications, Nov. 18, 2005.

Xunqi, et al: "The Accuracy of Gilbert Models in Predicting Packet-Loss Statistics for a Single-Multiplexer Network Model" INFOCOM 2005. 24th Annual Joint Conference of the IEEE Computer and Communications Societies. Proceedings IEEE Miami, FL, USA, Mar. 13-17, 2005, Piscataway, NJ, USA,IEEE, Mar. 13, 2005, pp. 2602-2612.

Hong, et al., "Packet loss performance due to buffer overflow at transmitter side of wireless link" Electronics Letters, IEE Stevenage, GB, vol. 38, No. 23, Nov. 7, 2002, pp. 1432-1434.

Kim et al. "Quality of service over wireless ATM links" INFOCOM '99. Eighteenth Annual Joint Conference Of The Ieee Computer And Communications Societies. Proceedings. IEEE New York, NY, USA Mar. 21-25, 1999, Piscataway, NJ, USA,IEEE, US, vol. 3, Mar. 21, 1999, pp. 1003-1010.

(Continued)

*Primary Examiner*—Stephen M Baker
(74) *Attorney, Agent, or Firm*—David N. Lathrop; Gallagher & Lathrop

(57) ABSTRACT

The loss of packets in a communication system can be minimized in an optimal manner by adapting a set of error correction (EC) parameters in response to a calculated probability of packet loss. The calculated probability is obtained from derived algorithms that are applied to a set of communication parameters. Algorithms are derived from Bernoulli-distributed traffic models and constant bit rate (CBR) traffic models of the communication system. A collapsed-state model is used to derive a very efficient algorithm that calculates an approximate probability of packet loss. Alternate applications for the algorithms are also disclosed.

22 Claims, 2 Drawing Sheets

OTHER PUBLICATIONS

Ait-Hellal ,et al., "On loss probabilities in presence of redundant packets and several traffic sources" Performance Evaluation, vol. 36-37, Aug. 1999, pp. 485-518.

Ait-Hellal et al., "On Loss Probabilities in Presence of Redundant Packets and Several Traffic Sources," Performance Evaluation, Elsevier Science B.V., 1999, vol. 36-37, pp. 485-518.

Altman et al., "Loss Probabilities for Messages with Redundant Packets Feeding a Finite Buffer," IEEE Journal on Selected Areas in Communication, Jun. 1998, vol. 16, No. 5, pp. 779-787.

Blondia, "The N/G/1 Finite Capacity Queue," Communications in Statistics—Stochastic Models, 1989, vol. 5, No. 2, pp. 273-294.

Bolot et al., "Adaptive FEC-Based Error Control for Internet Telephony," Proc. of Infocom 1999, Joint Conference of the IEEE Computer and Communications Societies, New York, Mar. 1999, vol. 3, pp. 1453-1460.

Boutremans et al., "Adaptive Joint Playout Buffer and FEC Adjustment for Internet Telephony," Proc. of Infocom 2003, Joint Conference of the IEEE Computer and Communications Societies, San Francisco, Mar. 2003, vol. 1, pp. 652-662.

Cidon et al., "Analysis of Packet Loss Processes in High Speed Networks," IEEE Trans. on Information Theory, Jan. 1993, vol. IT-39, No. 1, pp. 98-108.

Dán et al., "Analysis of the Packet Loss Process in an MMPP+M/M/1/K Queue," KTH, Royal Institute of Technology, Kista, Sweden, Department of Microelectronics and Information Technology, Technical Report, TRITA-IMIT-LCN R 04:02, ISSN 1651-7717, ISRN KTH/IMIT/LCN/R-04/02-SE, (2004).

Dán et al., "Analysis of the Packet Loss Process for Multimedia Traffic," Proc. Twelfth International Conference on Telecommunication Systems, Modeling and Analysis, Monterey, CA, Jul. 2004, pp. 83-94.

Figuereido et al, "Efficient Mechanisms for Recovering Voice Packets in the Internet," IEEE Global Internet Symposium, Rio de Janeiro, Dec. 1999, pp. 1830-1836.

Frossard et al., "FEC Performances in Multimedia Streaming," IEEE Communications Letters, Mar. 2001, vol. 5, No. 3, pp. 122-124.

Frossard et al., "Joint Source/FEC Rate Selection for Quality-Optimal MPEG-2 Video Delivery," IEEE Transactions on Image Processing, Dec. 2001, vol. 10, No. 12, pp. 1815-1825.

Gurewitz et al., "The Ballot Theorem Strikes Again: Packet Loss Process Distribution," IEEE Trans. On Information Theory, Nov. 2000, vol. IT-46, No. 7, pp. 2599-2595.

Hayasaka et al., "Packet/Cell Loss Recovery Using Variable FEC Matrix for Real Time Transport Services Over Best Effort Networks," IEEE Asia-Pacific Conference on Communications, Penang, Malaysia, Sep. 2003, vol. 3, pp. 1119-1123.

Johanson , "Adaptive Forward Error Correction for Real-Time Internet Video," International Packet Video Workshop, Nantes, France, Apr. 2003.

Kousa et al., "Performance of ATM Networks Under Hybrid ARQ/FEC Error Control Scheme," IEEE/ACM Transactions on Networking (TON), Dec. 1999, vol. 7, No. 6, pp. 917-925.

Lee et al., "Optimal Allocation of Packet-Level and Byte-Level FEC in Video Multicast Over Wired and Wireless Networks," IEEE Global Internet Symposium, San Antonio, TX, Nov. 2001, pp. 1994-1998.

Libman et al., "Optimal FEC Strategies in Connections with Large Delay-Bandwidth Products," IEEE International Conference on Communications (ICC), Paris, Jun. 2004, vol. 7, pp. 3942-3946.

Nguyen et al., "Distributed Video Streaming with Forward Error Correction," International Packet Video Workshop, Pittsburg, PA, Apr. 2002.

Ni et al., "QoS Issues and Enhancements for IEEE 802.11 Wireless LAN," INRIA Research Report No. 4612, Nov. 2002, http://www-sop.inria.fr/rodeo/personnel/Ni.Qiang/RR-4612.pdf.

Rizzo, "Effective Erasure Codes for Reliable Computer Communication Protocols," ACM Computer Communication Review, Apr. 1997, vol. 27, No. 2, pp. 24-36.

Su et al., "Optimal FEC Assignment for Scalable Video Transmission over Burst Error Channel with Loss Rate Uplink," International Packet Video Workshop, Nantes, France, Apr. 2003.

\* cited by examiner

METHOD AND SYSTEM FOR OPTIMIZING FORWARD ERROR CORRECTION OF MULTIMEDIA STREAMING OVER WIRELESS NETWORKS

TECHNICAL FIELD

The present invention pertains to optimizing the operation of devices that process streams of information arranged in packets for transmission to receivers, and is directed more particularly to adapting the operation of the devices to minimize packet losses at a receiver. The present invention may be used advantageously in systems that transmit streams of packets carrying multimedia information over wireless networks.

BACKGROUND ART

The delivery of real-time multimedia traffic over wireless networks is expected to be an important application in Third Generation Cellular, WIFI and WIMAX wireless networks. In these applications, multimedia information such as digital data representing images and sounds are organized into packets. Multimedia sources send streams of these packets to processing devices such as wireless access points that transmit the packets over wireless communication channels to end-user receivers. If a processing device is unable to transmit a packet immediately, it temporarily stores the packet in a queue or buffer until it can be transmitted. For example, a processing device may not be able to transmit a packet when the wireless communication channel is being used by another processing device.

The perceived quality of the multimedia information as received by the end user can be adversely affected by a number of factors including packet loss, packet delay and delay jitter. Packet loss includes missing packets, which are not received by the end-user receiver, and corrupted packets, which are received but the information they carry has been corrupted. These packet losses may be caused by: (1) noisy communication channels, (2) simultaneous transmissions or "collisions" with packets sent by multiple transmitters, and (3) overflow of the buffers used in the processing devices to temporarily store packets before they are transmitted. Buffer overflow can occur when a processing device must temporarily store a packet in its buffer but the buffer is already full. The packet losses caused by noisy communication channels and collisions are referred to herein as Type I losses and the packet losses caused by buffer overflow are referred to herein as Type II losses.

A number of techniques have been proposed to reduce the perceived effects of Type I and Type II packet losses. One technique known as Forward Error Correction (FEC) enables a receiver to recover the information carried by missing or corrupted packets provided the conditions that caused the losses are not too frequent and do not last too long. The length and frequency of the error-causing conditions that can be handled by FEC are controlled by two parameters n and k, where a number (n−k) of "FEC packets" are combined with a number k of multimedia packets to form a set of packets with a total number of n multimedia+FEC packets. If a receiver can receive at least k of the n packets without corruption, then any losses due to missing and corrupted packets can be corrected. If fewer than k packets out of the n packets are received without corruption, then the information losses for one or more packets cannot be recovered.

Unfortunately, FEC has a cost. The additional number (n−k) of FEC packets increases the risk of delays due to collisions and increases either the time or the channel bandwidth needed to transmit each set of packets. The values of the FEC parameters (n,k) may be chosen to optimize a tradeoff between competing requirements. A higher ratio $$\varphi = \frac{n}{k}$$

increases the level of error correction that is possible but also increases delays and increases the needed channel bandwidth by a factor of $\varphi$.

The FEC parameters (n,k) can be chosen to meet requirements for protection, delay and bandwidth for a specified rate of packet loss. Unfortunately, it may be impossible to meet all requirements simultaneously and a compromise among the various requirements may be necessary. Furthermore, the available channel bandwidth imposes a practical limit on the ratio $\varphi$. A very high ratio may impose a bandwidth requirement that either causes the starvation of packets from other data sources or exceeds the available bandwidth of the communication channel. The optimal choice of the FEC parameters should take into account the available bandwidth of the channel as well as the bandwidth required by packets provided by other data sources.

In practice, however, the conditions in a communication system can change rapidly. An optimum choice of FEC parameters that provides the desired level of protection with the least increase in bandwidth requires that the FEC parameter values (n,k) be set adaptively. What is needed is a way to adapt these FEC parameters that can be implemented by a process having low computational complexity. This would allow the FEC system to adapt itself in real time using devices with only modest processing power that can be incorporated into typical network equipment at low cost.

An adaptive FEC system according to the present invention can be implemented more effectively if facilities are available to measure conditions periodically and provide those measurements to the portion of the system that adapts the FEC parameters. The existence of such a measurement facility is assumed throughout the remainder of this disclosure. No particular measurement facility is essential to the present invention in principle. For ease of explanation, the following discussion assumes a facility is available to measure all traffic rates and losses that are needed as input parameters to the communication system models described below. An implementation of the present invention can use these measurements along with other parameters to adapt the FEC parameter values (n, k) to minimize the effects of Type II packet losses.

DISCLOSURE OF INVENTION

It is an object of the present invention to provide for the adaptation of error-correction parameters in a packet communication system to minimize the effects of packet losses using a process that is computationally efficient.

One aspect of the present invention controls the provision of packets in a communication system including a first data source that provides a source signal conveying information arranged in a set of packets comprising a first number of data packets and a second number of error-correction packets; a packet processing device that receives the source signal, stores information for at least some of the packets in the set of packets in a buffer having a buffer size, and transmits an output signal comprising packets of information of which at least some was stored in the buffer, where information for at least some of the packets in the set of packets is omitted from the output signal due to losses caused by the buffer being full; and a receiver that receives at least some of the packets in the output signal and applies an error correction process to these received packets to recover corrupted or missing information. The control is achieved by (a) receiving one or more signals conveying parameters representing the buffer size, the first and second numbers, an arrival probability that a packet from the first data source is received by the packet processing device during an interval of time, a transmission probability that the packet processing device successfully transmits a packet during the interval of time when the buffer is not empty, and an interference probability that a competing packet from any competing data source is received by the packet processing device during the interval of time; (b) deriving from the parameters a measure of loss probability that information in a data packet is lost and not recovered by the error correction process, where the measure of the loss probability is derived by a process that accounts for losses caused by the buffer being full and where either: (1) the process has a computational complexity that is independent of the buffer size and the loss probability has a value from zero to one for all values of the arrival probability, the transmission probability and the interference probability from zero to one, or (2) the process represents a solution of a model in which packets in the source signal arrive at the packet processing device according to a deterministic process; and (c) adapting the first number or the second number in response to the measure of the loss probability.

Another aspect of the present invention controls the provision of packets in a communication system including a first data source that provides a source signal conveying information arragned in a set of packets; a packet processing device that receives the source signal, stores information for at least some of the packets in the set of packets in a buffer having a buffer size, and transmits an output signal comprising packets of information of which at least some was stored in the buffer, where information for at least some of the packets in the set of packets is omitted from the output signal due to losses caused by the buffer being full; and a receiver that receives at least some of the packets in the output signal. The control is achieved by (a) receiving one or more signals conveying parameters representing the buffer size, an interference probability that a competing packet from any competing data source is received by the packet processing device during the interval of time, and a transmission probability that the packet processing device successfully transmits a packet during the interval of time when the buffer is not empty; (b) deriving from the parameters a respective loss probability for each of a plurality of arrival probabilities, where each respective loss probability represents a probability that information in a data packet is lost and is derived by a process that accounts for losses caused by the buffer being full, where each arrival probability represents a probability that a packet from the first data source is received by the packet processing device during an interval of time, and where either: (1) the process has a computational complexity that is independent of the buffer size and the loss probability has a value from zero to one for all values of the arrival probability, the transmission probability and the interference probability from zero to one, or (2) the process represents a solution of a model in which packets in the source signal arrive at the packet processing device according to a deterministic process; (c) selecting the arrival probability from which a minimum loss probability in the plurality of loss probabilities is derived; and (d) adapting operation of the first data source such that the packet process-ing device receives packets in a manner that more closely reflects the selected arrival probability.

The various features of the present invention and its preferred embodiments may be better understood by referring to the following discussion and the accompanying drawings. The contents of the following discussion and the drawings are set forth as examples only and should not be understood to represent limitations upon the scope of the present invention.

MODES FOR CARRYING OUT THE INVENTION

A. Introduction

1. Communication System

Figure 1:
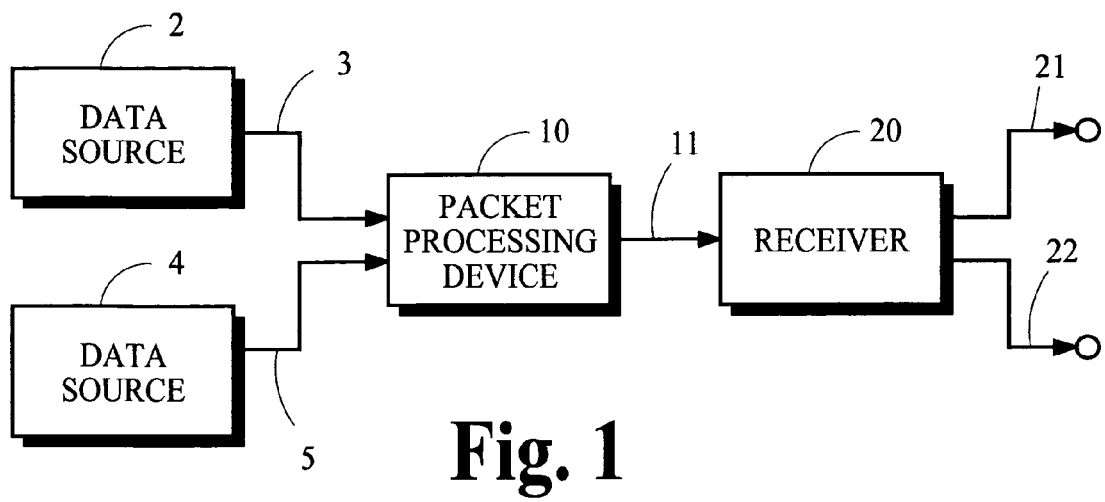
FIG. 1 is a schematic illustration of a communication system.

FIG. 1 is a schematic illustration of a communication system in which one or more data sources 2, 4 provide source signals that convey information arranged in packets. The information carried in at least some of the packets may be multimedia information, for example. The source signal provided by the data source 2 conveys information arranged in sets of packets referred to as "primary packets" because the servicing of these packets is the subject of the present invention. The sets of primary packets include primary data packets and primary error-correction (EC) packets. A set includes a number k of primary data packets and a number (n–k) of primary EC packets, for a total of n primary packets in the set. Other data sources such as the data source 4 also provide source signals conveying information arranged in packets referred to as "competing packets" because these latter packets compete for resources needed to service the primary packets; however, the source signals from these other data sources need not carry the same type of information and the competing packets need not be arranged in the same manner as that described for the data source 2.

The source signals from each of the data sources 2, 4 are passed along the communication paths 3, 5, respectively, to the packet processing device 10. These communication paths 3, 5 may be implemented by a wide variety of media including metallic wires and optical fibers, for example. The packet processing device 10 receives packets from each of the data sources 2, 4 and stores information for at least some of the packets in a queue or buffer. The packet processing device 10 transmits packets of information along the communication path 11 to the receiver 20. In the example shown in the figure, the receiver 20 processes packets of information from the data sources 2, 4. It applies an EC process as needed to the primary packets of information received from the data source 2 and passes the resulting information along the communication path 21. It passes the competing packets of information from the data source 4 along the communication path 22. The communication system may include other receivers, transmitters and data sources as desired.

This communication system may incorporate other techniques such as quality-of-service processes or additional EC processes. A quality-of-service process may be used to prevent or reduce all packet losses. This can be accomplished for primary packets, for example, by having either the data source 2 or the packet processing device 10 retransmit those primary packets that the receiver 20 does not acknowledge receiving. One or more EC processes in addition to the EC process mentioned above and discussed below may also be used. These additional EC processes can be implemented in the packet processing device 10 and the receiver 20 to reduce Type I losses. The incorporation of these additional processes would decrease the rate that original packets can be sent over the communication path 11 because some of the path bandwidth is needed for retransmission of packets and for the additional EC packets of the second EC process. As a result, the probability of Type I losses would increase accordingly. The use of quality-of-service and additional EC processes are not included in the communication models that are discussed below but could be incorporated if desired.

The schematic illustration shown in FIG. 1 does not include a number of components that may be desirable in a practical implementation of a communication system but are not needed to explain the present invention. For example, the figure does not illustrate the components that would be needed to establish whether the communication path 11 is clear, that is, whether other packet processing devices are currently using the communication path 11 or whether some type of interference exists that is likely to prevent reception by the receiver 20. Also not shown are components that would be needed to obtain from the receiver 20 any information on packet losses or the need to retransmit packets.

2. Communication System Model

Implementations of various aspects of the present invention are based on a calculation of Type II loss probability using algorithms derived from models of the communication system. The models derive the probability of Type II primary packet loss as a function of several parameters described below. Each of these parameters affects the level of buffer occupancy, which in turn affects the probability of Type II losses.

The model of the communication system can take into account how changes in the EC parameters (n,k) affect the primary data packet rates, thereby allowing an adaptive EC system to be designed that minimizes Type II primary packet losses. In the derivation described below, the method takes into account the arrival patterns of all packets at the packet processing device 10, the size of the buffer in the packet processing device 10, and the availability of the communication path 11. This model is then used to derive an algorithm that can calculate the probability of Type II primary packet losses and then adapt the EC parameters (n,k) to minimize the loss of primary data packets after error recovery by the EC process.

The communication model described below assumes that no process other than the adaptive EC process mentioned above is used to mitigate Type II losses. One example of a process that is not included in the model is a quality-of-service protection process in which the data source 2 sends again any primary packet that the receiver 20 does not acknowledge receiving. The receiver 20 sends acknowledgements to the data source 2 for the packets that it does receive. If the data source 2 does not receive an acknowledgement within some period of time, it sends again one or more primary packets that are presumed to be lost. This process mitigates both Type I and Type II losses. It is possible to include such a process in the model by taking into account the fact that primary packets sent more than once increase the rate at which primary packets arrive at the packet processing device 10, which increase buffer occupancy and increase the rate of Type II losses. The frequency that packets are sent again depends in turn on the loss probability.

a) Basic Approach

As described below, two Markov-based steady-state models are developed and solved that describe buffer occupancy as a function of: (1) the rate of primary packets that arrive at the packet processing device 10 from the data source 2, (2) the rates of competing packets that arrive at the packet processing device 10 from other data sources, (3) the probability that a primary packet is transmitted by the packet processing device 10 and received by the receiver 20 without corruption, (4) the size of the buffer or queue in the packet processing device 10, and (5) the EC parameters (n,k). One of these models describes a system in which the primary packets arrive at the packet processing device 10 according to a probabilistic process with a probability distribution that conforms to a Bernoulli process. The other model describes a system in which the primary packets arrive at the packet processing device 10 according to a deterministic process that conforms to a constant bit rate (CBR) process. If no EC process is used, each of these models is used to calculate, as a function of buffer occupancy, the probability of a Type II loss for any single data packet in the set of primary packets provided by the data source 2. If an EC process is used, the probability of primary data packet loss after EC recovery is then calculated as a function of the EC parameters (n,k).

The mathematical analysis for the two models differ significantly. For CBR traffic, singular value decomposition is used to solve the steady state Markov model. (See Press et al., *Numerical Recipes in C+++: The Art of Scientific Computing*, 2nd ed., Cambridge University Press, 1992.) For Bernoulli-distributed traffic, the theory of linear recurrent equations is applied to establish a closed-form solution for the Markov model. In addition, the calculation of packet loss probability after EC recovery differs for the two kinds of traffic. For Bernoulli-distributed traffic, statistically independent arrivals of data packets and EC packets is assumed, which allows an application of a simple combinatoric argument to determine the packet loss probability. For CBR traffic, an iterative mathematical procedure is developed that reflects the exact arrival pattern of data and EC packets. For each model, the traffic for competing packets is assumed to be Bernoulli distributed. This is a conservative assumption because it implies the data source 2 and the receiver 20 do not know the actual process for the competing packets. Because the arrival process for the primary packets sent by the data source 2 is known and can be controlled, however, the effects of different processes for this traffic can be investigated.

The present invention may be used advantageously in communication systems where the packet processing device 10 transmits multimedia packets using radio frequency (RF) or other wireless technology for the communication path 11; however, the present invention is not limited to any particular type of data packet or to any particular communication technology. The only property of a wireless communication path that affects the following models is the allowance for an appreciable probability that a primary packet is not transmitted or received successfully. A wired or optical technology can be modeled instead by reducing this probability to zero or to some arbitrarily small value.

b) Overview of Derivations

The following sections describe a generic communication model, derive a generic algorithm to calculate the loss probability of individual packets, derive an analytic communication model for Bernoulli-distributed traffic, derive a communication model for CBR traffic, and calculate the loss probability after EC recovery for each model. Because the algorithm used to calculate the loss probability for CBR traffic is computationally complex, an algorithm that calculates an approximation to the loss probability is derived that is much less complex.

B. Communication System Models

1. Overview

The two communication models discussed below describe the operation of a communication system like the system illustrated in FIG. 1. The model allows for the existence of one or more receivers in addition to the receiver 20. According to these models, the packet processing device 10 receives packets from the data sources and stores them in a buffer. A packet is subsequently retrieved from the buffer and transmitted along the communication path 11. The models assume that packets are stored and retrieved from the buffer in first-in-first-out (FIFO) order. If the buffer is full when a packet arrives, that packet is discarded. The techniques described below can derive models that can accommodate other queuing policies but the mathematical analysis may be more complicated.

The models discussed below are discrete-time models in which the packet processing device 10 receives and transmits packets during uniform intervals of time referred to as time slots. To simplify the model, all packets have the same fixed size.

The models assume that in any given time slot the packet processing device 10 can receive a primary packet and a competing packet, and can transmit a packet. This assumption simplifies calculations; however, the assumption can be relaxed if desired to derive more general models. A "Bernoulli-traffic model" describes a communication system where primary packets arrive at the packet processing device 10 in a manner that can be described by a probabilistic process having a Bernoulli probability distribution. The probability that one of these packets arrives at the packet processing device 10 within any given time slot is represented by the symbol $p_A$, where $0 \leq p_A \leq 1$. A "CBR-traffic model" describes a communication system where the primary data packets arrive at the packet processing device 10 in a manner that can be described by a deterministic process in which packets arrive at a constant rate of once per each m time slots. For ease of discussion, the ratio $$\frac{1}{m}$$

is also referred to as an arrival probability and is represented by the symbol $p_A$. Because the packets are assumed to convey a fixed amount of information or number of bits, a constant packet arrival rate is equivalent to a constant bit rate (CBR); hence the second model is referred to as a CBR-traffic model.

Both models assume all competing packets, which are those packets provided by data sources other than the data source 2, arrive at the packet processing device 10 in a manner that can be described by a probabilistic process having a Bernoulli probability distribution. The probability that a competing packet arrives at the packet processing device 10 within any given time slot is represented by the symbol $p_C$, where $0 \leq p_C \leq 1$. This assumption is reasonable for most applications because the processes used by other data sources to send competing packets is generally unknown. Any technique that can be used to measure or estimate the arrival of competing packets can be used to derive a distribution for the arrival process of the competing packets, and the techniques described below can be used to construct a model that reflects the arrival process. If the arrival process is unknown, however, a Bernoulli distribution is a conservative assumption. Because the models described below are concerned with only the accumulative arrival probability $p_C$ of all competing packets, these models assume the existence of only one data source for competing traffic. This one source may represent the accumulative effect of multiple data sources.

Both models also assume that, for each time slot in which at least one packet is stored in the buffer, the packet processing device 10 successfully retrieves a packet from the buffer and transmits it over the communication path 11 with a probability represented by the symbol $p_D$, where $0 \leq p_D \leq 1$. A packet is deemed to have been transmitted successfully if the information it conveys is received without corruption by the receiver 20. Information in a packet may be corrupted by a collision with other packets transmitted along the same communication path by other devices, or by noise or other interference. In preferred implementations, the risk of corruption is reduced by having the packet processing device 10 determine whether the communication path 11 is clear before attempting to transmit a packet.

Depending on the particular application for the information conveyed by the packet, the corrupted information may or may not be useable. For example, corrupted video information in a video frame that is only partially corrupted may be replaced in some instances by a prediction based on uncorrupted video information. (See Wah et al., "A Survey of Error-Concealment Schemes for Real-Time Multimedia and Video Transmissions over the Internet," IEEE Int. Symposium on Multimedia Software Eng. 2000, Taipei, Taiwan.) In contrast to that example, it may not be possible to recover or replace the information in a corrupted packet conveying highly compressed audio information. The models described below assume that partially corrupted packets do not contain any useful information and use the probability $p_D$ that a packet is transmitted without corruption to the receiver 20. If desired, a probability that corrupted packets can be at least partially restored can be integrated into the model by defining an additional probability that a packet is received partially damaged by the receiver 20. An appropriate probability $p_D$ can be derived from this additional probability using a Gilbert model of the communication path 11. (See Bolot et al., "Adaptive FEC-based error control for Internet telephony," IEEE Infocom 2003, San Francisco.)

In systems that have multiple competing data sources, it is possible that on average more than one competing packet can arrive in a time slot, which can be expressed by the relation $p_C > 1$. To simplify calculations, the following models assume $0 \leq p_C, p_A, p_D \leq 1$. This assumption can be met by reducing the length of each time slot such that $p_C, p_A, p_D < 1$.

The models and subsequent derivations described below consider packet losses but do not consider delay and delay jitter. Furthermore, the models consider packet traffic that flows only from data sources to the receivers and do not consider signals that flow from the receivers to the data sources.

2. Analysis of Buffer Operation

The models described below assume that the packet processing device 10 has a queue or buffer of length L, and that in each time slot the device attempts to store in this buffer any primary packet received from the data source 2 and any competing packet received from other data sources. According to these models, the operations performed by the device to store packets in the buffer may be described as follows:

1. In any give time slot, the device receives a primary packet from the data source 2 with probability $p_A$ and receives a competing packet from another source with probability $p_C$. If both a primary packet and a competing packet are received in the same time slot, it is assumed that either packet may arrive before the other with equal probability. In other words, it is assumed that the competing packet arrives before the primary packet with a probability equal to 0.5.
2. The total number j of primary and competing packets that can arrive in a given time slot may be any number in the set {0,1,2}. Arriving packets may be stored in the buffer or may be discarded according to the following rules:
    a) If the level of buffer occupancy just prior to the arrival of these packets is less than or equal to L−j, then all arriving packets are stored in the buffer.
    b) If j=2 and the level of buffer occupancy is L−1, then the earlier of the two arriving packets is stored in the buffer and the later-arriving packet is discarded.
    c) Otherwise, all arriving packets are discarded.
3. In any given time slot, with probability $p_D$ the packet processing device 10 retrieves a packet from the buffer and transmits it along the communication path 11 so that the information the packet conveys is received without corruption. Packets are stored into and retrieved from the buffer in FIFO order. If the buffer is empty, no packet is retrieved and transmitted. The level of buffer occupancy is decreased by one if a packet is retrieved and transmitted.

The models described below include a steady-state vector that describes the statistical occupancy of the buffer. This vector is expressed as:

$$P=(P_N) \text{ for } 0 \leq N \leq L \quad (1)$$

where $P_N$=probability that the buffer stores N packets at the end of a time slot; and L=size or length of the buffer.

This steady state vector can be expressed as a function of the parameters $p_A$, $p_C$, $p_D$ and L.

Expressions for this function are derived below.

C. Packet Loss Probability

1. Introduction

A primary packet from the data source 2 is discarded by the packet processing device 10 if either of two conditions exist during the time slot when the primary packet arrives at the device: (1) the buffer occupancy is L or (2) the buffer occupancy is L−1 and a competing packet arrived before the primary packet. The probability $P_{loss}$ that an arriving primary data packet will be discarded in a given time slot can be expressed as:

$$P_{loss} = \frac{1}{2} P_{L-1} p_C + P_L \quad (2)$$

The factor one-half reflects the assumption that when a primary packet and a competing packet arrive in the same time slot, the probability that the competing packet arrives before the primary packet is equal to 0.5.

The steady state vector P can be calculated from a transition matrix whose entries represent the probability of a transition between different states of P. A generalized parametric expression of the transition matrix is first developed. This generalized expression can then be adapted for the Bernoulli-traffic and the CBR-traffic models by making appropriate choices for the parameters.

2. Transition Matrix

The transition matrix is denoted by the symbol T and the notation $T_{a,b}$ is used to represent the probability that the level of buffer occupancy changes from a to b between consecutive time slots, where $0 \leq a,b \leq L$. The level of buffer occupancy is measured at the end of each time slot after any transmitted packet has been removed from the buffer. The notation $(T_{a,b})^u$ is used to represent the probability that the level of buffer occupancy changes from a to b across u time slots, where $u \geq 1$; thus $T_{a,b}=(T_{a,b})^1$.

Elements of the transition matrix may be expressed as follows:

$$T_{a,b} = \begin{cases} q_A q_C + q_A p_C p_D + p_A q_C p_D & \text{for } a=0, b=0 \\ p_A p_C q_D & \text{for } a=k-2, b=k, 2 \leq k \leq L \\ p_A p_C p_D + p_A q_C q_D + q_A p_C q_D & \text{for } a=k-1, b=k, 1 \leq k \leq L-1 \\ q_A q_C q_D + q_A p_C p_D + p_A q_C p_D & \text{for } a=k, b=k, 1 \leq k \leq L-2 \\ q_A q_C p_D & \text{for } a=k+1, b=k, 0 \leq k \leq L-1 \\ q_A q_C q_D + q_A p_C p_D + p_A q_C p_D + p_A p_C p_D & \text{for } a=L-1, b=L-1 \\ p_A q_C q_D + q_A p_C q_D + p_A p_C q_D & \text{for } a=L-1, b=L \\ p_D & \text{for } a=L, b=L-1 \\ q_D & \text{for } a=L, b=L \\ 0 & \text{for all other } a \text{ and } b \end{cases} \quad (3)$$

where $q_A$=probability that no primary packet arrives in a time slot, or $q_A$=1−$p_A$;

$q_C$=probability that no competing packet arrives in a time slot, or $q_C$=1−$p_C$; and $q_D$=probability that a data packet is not successfully transmitted in a time slot, or $q_D$=1−$p_D$.

A data packet is not successfully transmitted in those time slots for which an attempted transmission fails, no transmission is attempted, and a packet is retransmitted as part of a quality-of-service protection process.

For example, the element $T_{0,0}$ represents the probability that, given the buffer is empty at the end of one time slot, the buffer will also be empty at the end of the next time slot. This situation can occur as the result of any of three possible situations whose probabilities are expressed by each of three terms for $T_{0,0}$ as shown in expression 3. The first term $q_A q_C$ represents the probability that the no primary packet and no competing packet arrives in the next time slot. The second term $q_A p_C p_D$ represents the probability that no primary packet arrives, that a competing packet arrives and is stored in the buffer, and that a packet is removed from the buffer and transmitted. The third term $p_A q_C p_D$ represents the probability that a primary packet arrives and is stored in the buffer, that no competing packet arrives, and that a packet is removed from the buffer and transmitted.

D. Probability of Type II packet Loss for Bernoulli-Traffic Model

A model to calculate the probability of a Type II packet loss for Bernoulli distributed traffic without EC protection is first developed. This model is then modified to calculate the probability of packet loss for Bernoulli distributed traffic with EC protection.

1. Steady State Model for Bernoulli-Distributed Traffic without EC Protection The first step to develop the Bernoulli-traffic model is to derive a calculation for the steady-state vector P for Bernoulli-distributed traffic without EC protection. In many applications of Markov models, it is not possible to derive an explicit formula for the steady state vector P but this vector can be expressed as a result of singular value decomposition of a matrix decomposition. Unfortunately, this approach is not attractive because it yields a solution that is not in a closed form and is computationally very complex. Instead, the theory of linear recurrent equations is used to establish a closed form expression for P. This is done by first deriving a rather complex and computationally expensive formula for P in Theorem 1, which is then simplified in Theorem 2.

Theorem 1 is proved as shown below.

Theorem 1

$$P_0 = \frac{1}{1+\sum_{j=1}^{L-1}\frac{W^j}{Y^j}B_j + \frac{Z}{p_D}} \quad (4)$$

$$P_j = P_0\frac{W^j}{Y^j}B_j,\ L-1 \geq j \geq 1 \quad (5)$$

$$P_L = \frac{P_0}{p_D}Z \quad (6)$$

$$\text{where } B_j = \sum_{l=0}^{\frac{j}{2}}\left(\frac{XY}{W^2}\right)^l\binom{j-l}{l},\ 1 \leq j \leq L-1 \quad (7)$$

$$W = p_A p_C + q_A p_C q_D + p_A q_C q_D \quad (8)$$

$$X = p_A p_C q_D \quad (9)$$

$$Y = q_A q_C p_D \quad (10)$$

$$Z = (1+Y-p_D-q_A q_C q_D)\frac{W^{L-1}}{Y^{L-1}}B_{L-1} - (W-X)\frac{W^{L-1}}{Y^{L-2}}B_{L-2} - X\frac{W^{L-3}}{Y^{L-3}}B_{L-3} \quad (11)$$

Theorem 1 is proved by induction. From the definition of the transition matrix given in 3, the following relations can be derived:

$$P_0 = P_0(q_A q_C + q_A p_C p_D + p_A q_C p_D) + P_1 q_A q_C p_D \quad (12)$$

$$P_1 = P_1(q_A q_C q_D + q_A p_C p_D + p_A q_C p_D) + P_0(p_A p_C p_D + p_A q_C q_D + q_A p_C q_D) + P_2 q_A q_C p_D \quad (13)$$

$$P_j = P_j(q_A q_C q_D + q_A p_C p_D + p_A q_C p_D) + P_{j-1}(p_A p_C p_D + p_A q_C q_D + q_A p_C q_D) + P_{j+1}q_A q_C p_D + P_{j-2}p_A p_C q_D,\ 2 \leq j \leq L-2 \quad (14)$$

$$P_{L-1} = P_{L-1}(q_A q_C q_D + q_A p_C p_D + p_A q_C p_D + p_A p_C p_D) + P_L p_D + P_{L-2}(p_A p_C p_D + p_A q_C q_D + q_A p_C q_D) + P_{L-3}p_A p_C q_D \quad (15)$$

$$P_L = P_L q_D + P_{L-1}(p_A q_C q_D + q_A p_C q_D + p_A p_C q_D) + P_{L-2}p_A p_C q_D \quad (16)$$

Using the definitions given in expressions 7 to 11, the relations given in expressions 12 to 15 can be expressed as follows:

$$P_1 Y = P_0 W \quad (17)$$

$$P_2 Y = P_1(W+Y) - P_0(W-X) \quad (18)$$

$$P_{j+3}Y = P_{j+2}(W+Y) - P_{j+1}(W-X) - P_j X,\ 0 \leq j \leq L-4 \quad (19)$$

$$P_L p_D = P_{L-1}(1+Y-p_D-q_A q_C q_D) - P_{L-2}(W-X) - P_{L-3}X \quad (20)$$

The relations given in equations 17, 18 and 19 imply the relation given in equation 5 for j=1,2,3. The relation in equation 19 can be used to show that equation 5 also holds for $4 \leq j+3 \leq L-1$ provided it holds for j, j+1 and j+2. Using the definition given in equation 5 to rewrite the relation in equation 19, it may be seen that Theorem 1 can be proven by proving the following:

$$Y\frac{W^{j+3}}{Y^{j+3}}B_{j+3} = (W+Y)\frac{W^{j+2}}{Y^{j+2}}B_{j+2} - (W-X)\frac{W^{j+1}}{Y^{j+1}}B_{j+1} - X\frac{W^j}{Y^j}B_j \quad (21)$$

which is equivalent to $$W^3 B_{j+3} = W^3 B_{j+2} + W^2 Y B_{j+2} - W^2 Y B_{j+1} + WXY B_{j+1} - XY^2 B_j \quad (22)$$

which can be rearranged as follows:

$$W^3 B_{j+3} - W^3 B_{j+2} - WXY B_{j+1} = W^2 Y B_{j+2} - W^2 Y B_{j+1} - XY^2 B_j \quad (23)$$

It is known that:

$$\binom{i+1}{j} = \binom{i}{j} + \binom{i}{j-1} \quad (24)$$

$$\binom{i}{0} = 0 \quad (25)$$

where $$\binom{i}{j}$$

represents the binomial coefficient that equals the number of ways j unordered outcomes can be chosen from i possibilities.

Using the expressions in equation 7, the terms in the left-hand side of equation 23 can be rewritten as follows:

$$W^3 B_{j+3} = W^3 \sum_{l=0}^{\frac{j+3}{2}} \left(\frac{XY}{W^2}\right)^l \binom{j+3-l}{l} \quad (26)$$

$$W^3 B_{j+2} = W^3 \sum_{l=0}^{\frac{j+2}{2}} \left(\frac{XY}{W^2}\right)^l \binom{j+2-l}{l} \quad (27)$$

$$WXYB_{j+1} = WXY \sum_{l=0}^{\frac{j+1}{2}} \left(\frac{XY}{W^2}\right)^l \binom{j+1-l}{l} \quad (28)$$

$$= W^3 \sum_{l=1}^{\frac{j+3}{2}} \left(\frac{XY}{W^2}\right)^l \binom{j+1-(l-1)}{l-1}$$

By applying the relations in equations 24 and 25, and combining and simplifying these terms, the left-hand side of equation 23 can be shown to equal zero as follows:

$$W^3 B_{j+3} - W^3 B_{j+2} - WXYB_{j+1} = \quad (29)$$

$$A^3 \sum_{l=1}^{\frac{j+2}{2}} \left(\frac{BC}{A^2}\right)^l \left[\binom{j+3-l}{l} - \binom{j+2-l}{l} - \binom{j+2-l}{l-1}\right] +$$

$$A^3 \left(\binom{j+3}{0} - \binom{j+2}{0}\right) +$$

$$A^3 \sum_{l > \frac{j+2}{2}}^{\frac{j+3}{2}} \left(\frac{BC}{A^2}\right)^{l-1} \left[\binom{j+3-l}{l} - \binom{j+1-(l-1)}{l-1}\right] = 0$$

The terms in the right-hand side of equation 23 can be expressed as follows:

$$W^2 Y B_{j+2} = W^2 Y \sum_{l=0}^{\frac{j+2}{2}} \left(\frac{XY}{W^2}\right)^l \binom{j+2-l}{l} \quad (30)$$

$$W^2 Y B_{j+1} = W^2 Y \sum_{l=0}^{\frac{j+1}{2}} \left(\frac{XY}{W^2}\right)^l \binom{j+1-l}{l} \quad (31)$$

$$XY^2 B_j = W^2 Y \sum_{l=1}^{\frac{j+2}{2}} \left(\frac{XY}{W^2}\right)^l \binom{j-(l-1)}{l-1} \quad (32)$$

By applying the relations in equations 24 and 25, and combining and simplifying these terms, the right-hand side of equation 23 can be shown to equal zero as follows:

$$W^2 Y B_{j+2} - W^2 Y B_{j+1} - XY^2 B_j = \quad (33)$$

$$W^2 Y \sum_{l=1}^{\frac{j+1}{2}} \left(\frac{XY}{W^2}\right)^l \left[\binom{j+2-l}{l} - \binom{j+1-l}{l} - \binom{j+1-l}{l-1}\right] -$$

$$W^2 Y \left(\frac{XY}{W^2}\right)^l \left(\binom{j+2}{0} - \binom{j+1}{0}\right) -$$

$$W^2 Y \sum_{l > \frac{j+1}{2}}^{\frac{j+2}{2}} \left(\frac{XY}{W^2}\right)^l \left[\binom{j+2-l}{l} - \binom{j+1-l}{l-1}\right] = 0$$

It follows from equations 23, 29 and 33 that equation 5 is true for j+3. For j=L, equation 6 follows from equations 5 and 20. Equation 4 follows from equations 5 and 6, and the fact that $$\sum_{j=0}^{L} P_j = 1.$$

The expressions derived for $B_j$ in Theorem 1 can be simplified by extending the definition of $B_j$ as shown in equation 7 by defining $B_0=1$. This is done by showing the following:

Lemma 1

$$B_{j+1} = B_j + \left(\frac{XY}{W^2}\right) B_{j-1}, \; j \geq 1 \quad (34)$$

The relation in equation 34 is equivalent to the following:

$$\binom{j+1}{0} + \sum_{l=1}^{\frac{j}{2}} \left(\frac{XY}{W^2}\right)^l \binom{j+1-l}{l} + \sum_{l > \frac{j}{2}}^{\frac{j+1}{2}} \left(\frac{XY}{W^2}\right)^l \binom{j+1-l}{l} = \binom{j}{0} + \quad (35)$$

$$\sum_{l=1}^{\frac{j}{2}} \left(\frac{XY}{W^2}\right)^l \binom{j-l}{l} + \sum_{l=1}^{\frac{j}{2}} \left(\frac{XY}{W^2}\right)^l \binom{j-l}{l-1} + \sum_{l > \frac{j}{2}}^{\frac{j+1}{2}} \left(\frac{XY}{W^2}\right)^l \binom{j-l}{l-1}$$

From expression 25 it can be seen that the first term on the left-hand side of equation 35 and the first term on the right-hand side of the equation are both equal to one. From expression 24 it can be seen that the second term on the left-hand side of equation 35 is equal to the sum of the second and third terms on the right-hand side of the equation as seen in equation 36:

$$\sum_{l=1}^{\frac{j}{2}} \left(\frac{XY}{W^2}\right)^l \binom{j+1-l}{l} = \sum_{l=1}^{\frac{j}{2}} \left(\frac{XY}{W^2}\right)^l \binom{j-l}{l} + \sum_{l=1}^{\frac{j}{2}} \left(\frac{XY}{W^2}\right)^l \binom{j-l}{l-1} \quad (36)$$

From inspection, it may be seen that the third term on the left-hand side of equation 35 and the fourth term on the right-hand side of equation 35 are both equal to zero if the terms of summation are not within the range of summation from l=1 to ½ j and are both equal to one if the terms of summation are within the range of summation. This establishes Lemma 1, which shows that the terms $B_j$ can be expressed as generalized Fibonacci numbers.

Lemma 2

A series is now defined as $$x_0 = x_1 = 1 \text{ and } x_i = K_A x_{i-1} + K_B x_{i-2} \text{ for } i \geq 2 \quad (37)$$

where $K_A$ and $K_B$ are positive real numbers.

If $\alpha$ and $\beta$ are defined as the roots of the equation $x^2 = K_A x + K_B$, or $$\alpha = \frac{K_A + \sqrt{K_A^2 + 4K_B}}{2}$$

$$\beta = \frac{K_A - \sqrt{K_A^2 + 4K_B}}{2}$$

and are constrained to be unequal to one another, then it is known from the theory of linear recurrent equations that:

$$x_i = \frac{1}{\sqrt{K_A^2 + 4K_B}} [(1-\beta)\alpha^i + (\alpha-1)\beta^i] \quad (38)$$

It can be seen by inspection of expressions 37 and 38 that equation 38 is true for i=0,1 and it can be seen by induction that equation 38 is true for i≧2. By applying the relationship shown in equation 37 to the expression for $B_j$ in equation 34, it can be shown that $K_A$ and $K_B$ have the following values:

$$K_A = 1$$

$$K_B = \frac{XY}{W^2}$$

It follows that:

$$\alpha = \frac{1 + K_C}{2}$$

$$\beta = \frac{1 - K_C}{2}$$

where $$K_C = \sqrt{1 + 4\frac{XY}{W^2}} \quad (39)$$

This implies that $\beta = 1\alpha$. By using this relation to substitute for $\beta$ in equation 38, the expression for $B_j$ shown in equation 7 can be rewritten as $$B_j^* = \frac{1}{K_C} \left( \left(\frac{1+K_C}{2}\right)^{j+1} - \left(\frac{1-K_C}{2}\right)^{j+1} \right) \quad (40)$$

$$= \frac{1}{K_C} \frac{(1+K_C)^{j+1} - (1-K_C)^{j+1}}{2^{j+1}}$$

which is computationally less complex than the expression in equation 7.

Using the relations in equations 39 and 40 as substitutes for $B_j$ and $K_C$ allows a term in equation 4 to be rewritten as:

$$\sum_{j=1}^{L-1} \frac{W^j}{Y^j} B_j^* = \frac{W}{YK_C} \left[ \begin{array}{l} \left(\frac{1+K_C}{2}\right)^2 \cdot \sum_{j=0}^{L-2} \frac{(W(1+K_C))^j}{(2Y)^j} - \\ \left(\frac{1-K_C}{2}\right)^2 \cdot \sum_{j=0}^{L-2} \frac{(W(1-K_C))^j}{(2Y)^j} \end{array} \right] \quad (41)$$

$$= \frac{W}{YK_C} \left[ \begin{array}{l} \left(\frac{1+K_C}{2}\right)^2 \left( \frac{\frac{(W(1+K_C))^{L-1}}{(2Y)^{L-1}} - 1}{\frac{W(1+K_C)}{2Y} - 1} \right) - \\ \left(\frac{1-K_C}{2}\right)^2 \left( \frac{\frac{(W(1-K_C))^{L-1}}{(2Y)^{L-1}} - 1}{\frac{W(1-K_C)}{2Y} - 1} \right) \end{array} \right]$$

Algorithms for calculating the steady state vector P that are computationally less complex than the algorithms derived in Theorem 1 can be obtained by rewriting equations 4, 5 and 6 as follows:

$$P_0 = \frac{1}{1 + K_D + \frac{Z^*}{p_D}} \quad (42)$$

$$P_j = P_0 \frac{W^j}{Y^j} B_j^*, \quad T-1 \geq j \geq 1 \quad (43)$$

$$P_T = \frac{P_0}{p_D} Z^* \quad (44)$$

where $$K_D = \frac{W}{YK_C} \left[ \left(\frac{1+K_C}{2}\right)^2 \frac{\frac{(W(1+K_C))^{L-1}}{(2Y)^{L-1}} - 1}{\frac{W(1+K_C)}{2Y} - 1} - \left(\frac{1-K_C}{2}\right)^2 \frac{\frac{(W(1-K_C))^{L-1}}{(2Y)^{L-1}} - 1}{\frac{W(1-K_C)}{2Y} - 1} \right]$$

$$B_j^* = \frac{(1+K_C)^{j+1} - (1-K_C)^{j+1}}{2^{j+1} K_C}, \ 1 \le j \le L-1$$

$$W = p_A p_C + q_A p_C q_D + p_A q_C q_D$$

$$X = p_A p_C q_D$$

$$Y = q_A q_C p_D$$

$$Z^* = (1 + Y - p_D - q_A q_C q_D) \frac{W^{L-1}}{Y^{L-1}} B_{L-1}^* - (W - X) \frac{W^{L-1}}{Y^{L-2}} B_{L-2}^* - X \frac{W^{L-3}}{Y^{L-3}} B_{L-3}^*$$

2. Packet Loss Probability for Bernoulli-Traffic Model

When EC protection is not used, the probability of losing any one primary packet may be calculated using equations 2 and 42 to 44. When EC protection is used for Bernoulli-distributed traffic, it can be assumed that the probability of losing a data packet is independent of the probability of losing an EC packet. The additional EC packets increase the arrival rate of primary packets by a factor of $\phi$. As a result, the probability of arrival is increased by the same factor, which can be expressed as:

$$p_A \to \varphi \cdot p_A = \frac{n}{k} p_A \tag{45}$$

When EC protection is used, a primary data packet will be lost and not recovered if i data packets are lost and at least $s=(n-k-i+1)$ EC packets are lost, where $i>0$ and $s>0$. The probability of losing a data packet without EC recovery can be calculated by multiplying the probability to receive i primary data packets with the probability to receive at least s primary EC packets in equation 46:

$$p_i(k,n) = \tag{46}$$

$$\binom{k}{i}(P_{loss})^i(1-P_{loss})^{k-i} \sum_{m=s}^{n-k} \binom{n-k}{m}(P_{loss})^m(1-P_{loss})^{n-k-m}$$

where $p_i(k,n)$=probability to lose i data packets and at least s EC packets; and $s=\max(0, n-k-i+1)$.

The probability $P_{loss}$ shown in equation 46 is calculated as shown in equation 2 using the modified value for $p_A$ shown in equation 45. $P_{loss}$ now represents the probability that a primary data packet or a primary EC packet will be discarded.

The probability $E_{loss}$ to lose a primary data packet without EC recovery is equal to:

$$E_{loss} = \frac{1}{k} \sum_{i=1}^{k} i \cdot p_i(k,n) \tag{47}$$

and the probability $E_{rec}$ to recover a primary data packet after EC recovery is equal to:

$$E_{rec} = 1 - E_{loss} \tag{48}$$

E. Probability of Type II packet Loss for CBR-Traffic Model

1. Sending Scheme for CBR-Traffic Model with EC

Figure 2:
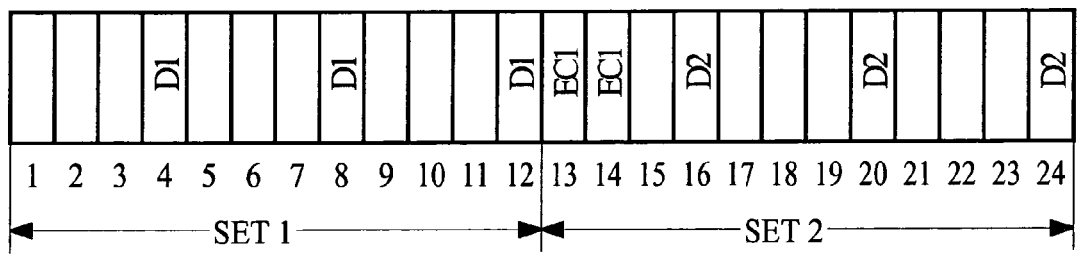
FIGS. 2-4 are schematic illustrations of sets of primary packets arranged in time slots according to a CBR-traffic model.

The algorithm to calculate the steady state vector P shown above was derived for a Bernoulli-traffic model of the communication system. The following sections derive an algorithm to calculate the vector P for a CBR-traffic model of the communication system. In this model, time slots are numbered from one to infinity and primary data packets arrive at the packet processing device in time slots t=m, 2m, ... where m>1. No primary data packets arrive during the m−1 intermediate time slots. A series of k primary data packets are combined with a series of (n−k) primary EC packets to form a set of n primary packets. An example of a set of packets with m=4, k=3 and n=5 is shown in FIG. 2. The k primary data packets in a first set, denoted with the label D1, arrive at the packet processing device 10 once in each interval of m time slots across an interval spanned by k·m time slots. The primary data packets in the next set, denoted with the label D2, arrive in the same manner during the next interval spanned by k·m time slots. The (n−k) EC packets for the first set, denoted by the label EC1, arrive in the free time slots between the data packets of the next set of primary packets. To guarantee the feasibility of this scheme, values for the EC parameters (n,k) are constrained such that the number of EC packets (n−k) does not exceed the number of free time slots for the next k data packets, which may be expressed as:

$$n-k \le k \cdot (m-1) \tag{49}$$

This arrival scheme may be formally described by:

$$e_i = \begin{cases} m, & 2 \le i \le k \\ 1, & i = k+1 \\ 1, & k+2 \le i \le n, t_i \ne 1 (\text{mod } m) \\ 2, & k+2 \le i \le n, t_i = 1 (\text{mod } m) \end{cases} \tag{50}$$

where $e_i = t_i - t_{i-1}$, for $2 \le i \le n$; and $t_i$=time slot in which the i-th packet in a set of primary packets arrives at the packet processing device 10.

The first line in expression 50 pertains to all data packets in a set of primary packets except the first primary data packet. The second line pertains to the first primary EC packet in a set, which immediately follows the last data packet in the set. The third line pertains to the primary EC packets that do not immediately follow a data packet in the next set of packets, and the last line pertains to those primary EC packets that do immediately follow a data packet in the next set of packets.

The CBR-traffic model derived below assumes that the packet processing device 10 discards the first packet out of a set of primary packets, which is always a primary data packet. This packet is discarded in such a manner that the probability it is discarded is independent of the probability any previous primary packet is discarded. For all subsequent packets in the set of primary packets, the probability a primary packet is discarded is calculated iteratively using the loss probability of the previous primary packet and the level of occupancy of the buffer when the previous primary packet arrived at the processing device 10. This iterative approach is consistent with the expression shown in equation 2, which expresses the fact that the level of buffer occupancy is at least L−1 whenever a primary packet is discarded. A condition where the level of occupancy was at least L−1 when the preceding primary packet arrived increases the probability that the level of occupancy will be at least L−1 when the next primary packet arrives as compared to a condition where the preceding packet was not discarded and buffer occupancy was at a lower level between zero and L−1. As a result, whether the packet processing device 10 discarded the preceding primary packet provides some information about the level of buffer occupancy, which in turn provides some information about the probability the next primary packet will be discarded.

2. Transition Matrix for CBR-Traffic Model

The transition matrix described above for the Bernoulli-traffic model is adapted here for the CBR-traffic model. For Bernoulli-distributed traffic, the arrival process is statistically equal for all time slots because that process depends only on the arrival probability $p_A$. As a result, the transition T matrix discussed above can provide a good description of the transition between probabilities of any two successive time slots. For CBR traffic, an average or composite arrival probability is $$p_A = \frac{1}{m};$$

however, the arrival process for CBR traffic is deterministic and each time slot can be placed into one of two classes. For time slots i=1 (mod m), primary packets arrive and a transition matrix F for these time slots can be obtained from expression 3 by substituting the value one for $p_A$ and the value zero for $q_A$. For time slots i≠1 (mod m), no primary packets arrive and a transition matrix G for these time slots can be obtained from expression 3 by substituting the value zero for $p_A$ and the value one for $q_A$. Products of the transition matrices F and G specify the arrival of packets in a sequence of time slots. Each time slot with a packet arrival is represented by the F matrix and each time slot with no packet arrival is represented by the G matrix.

3. Packet Loss Probability for CBR-Traffic Model without EC Protection

A steady state vector $\pi$ for buffer occupancy in the CBR-traffic model without EC protection can be expressed as follows:

$$\pi = (FG^{m-1})^T \pi \qquad (51)$$

where T denotes the transposition of the matrix product.

Equation 51 can be solved by the singular value decomposition of the matrix $(FG^{m-1})^T - I$, where I is the diagonal matrix with all diagonal entries equal to one, obtaining a one-dimensional solution space, and using the equation $$\sum_{i=0}^{L} \pi_i = 1 \qquad (52)$$

to determine the final value for $\pi$. The loss probability of a primary data packet can be calculated from a formula similar to equation 52 using the steady stated vector $\pi$ rather than using die steady state vector P:

$$P_{loss} = \frac{1}{2}\pi_{L-1} p_C + \pi_L \qquad (53)$$

4. Packet Loss Probability for CBR-Traffic Model with EC Protection

The approach used to derive a formula to calculate the loss probability for a CBR-traffic model without EC protection can be extended to derive a formula for a CBR-traffic model with EC protection. This is done by calculating the probability that any primary data packet of a set of k data packets cannot be recovered.

a) Definition of the Sending Scheme for Primary packets

The probability that the first out of n primary packets in a set of packets is lost can be determined from a steady state vector S of buffer occupancy for the time slot that immediately precedes the time slot in which the first primary data packet arrives. This steady state vector is derived for the set of m·k time slots during which the k data packets of a set of primary packets arrive. The (n−k) EC packets for the previous set of primary packets arrive during the first w time slots, where $$w = \left\lfloor \frac{m}{m-1}(n-k) \right\rfloor \qquad (54)$$

If m≦w, then some of the data packets of the current set of primary packets also arrive during the first w time slots. From equation 49, it can be seen that w≦m·k.

Additional values are defined as follows:

$$u = w(\bmod m) \qquad (55)$$

$$z = m - u \qquad (56)$$

$$f = \min(u, 1) \qquad (57)$$

$$y = \frac{k \cdot m - w - f \cdot z}{m} \qquad (58)$$

Figure 3:
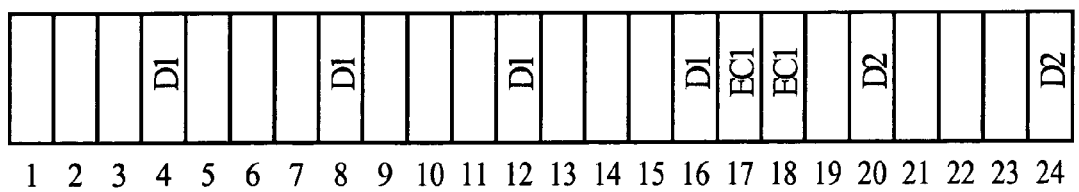
Figure 4:
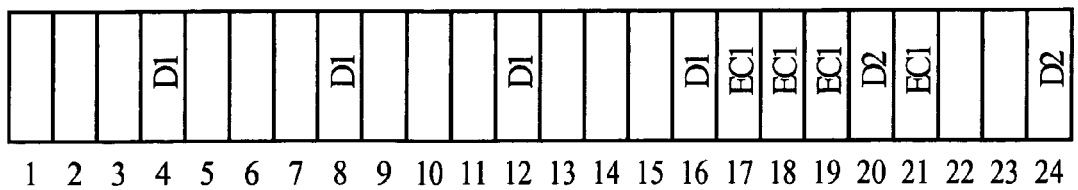

The value z−1 equals the number of time slots between the w-th time slot of the considered k·m time slots and the next primary data packet. The value y equals the number of cycles or periods of m time slots in which data packets have no intervening EC packets. The steady state S can be expressed in terms of these values. Expression 62 describes situations for m−1>w illustrated in FIG. 3, where m=4, k=4, n=6, w=2, u=2, z=2, f=1 and y=3. Expression 63 describes situations for m−1<w illustrated in FIG. 4, where m=4, k=4, n=8, w=5, u=1, z=3, f=1 and y=2. No expression is needed for w=m−1 because w is not congruent to m−1(mod m) for all m≧2. This can be seen for m=2 by inspection. When m=2, w must be an even number and cannot be congruent to m−1 (mod m). For m>2, this incongruity can be proven by contradiction by assuming the opposite, that is, by assuming there exists a value (n−k) such that $$\left\lfloor \frac{m(n-k)}{m-1} \right\rfloor = r \cdot m - 1 \quad (59)$$

By definition $$\left\lfloor \frac{m(n-k)}{m-1} \right\rfloor = \frac{m(n-k)}{m-1} - \frac{d}{m-1} \quad (60)$$

where
0≦d≦m−2, which together with expression 59 implies that $$n - k - r \cdot (m-1) = \frac{d-m+1}{m} \quad (61)$$

The expression shown in equation 61 cannot be true because the left-hand side is an integer but the right-hand side cannot be an integer. This contradicts the assumption expressed in equation 59, which implies w cannot be congruent to m−1 (mod m).

By definition of the arrival process described above, the steady state vector S may be expressed as:

$$S = (F^{w-m+1}(G^{z-1}F)^y(G^{m-1}F)^yF^{m-1})^T S \text{ for } m-1<w \quad (62)$$

$$S = (F(G^{m-1}F)^yF^wG^{z-1})^T S \text{ for } m-1>w \quad (63)$$

The steady state vector S can be determined in the same manner as the vector π is derived from equation 51 by using the equation 52 for S instead of π.

b) EC Recovery Probability

The calculation of the probability for recovering a discarded data packet using an EC process in the CBR-traffic model may calculated as explained in the following five steps.

Step 1: This step determines the conditional probability that the level of buffer occupancy is h at the end of time slot j+m−1 given the condition that the level of buffer occupancy is g at the end of time slot j. This probability U(m−1,g,h) may be expressed as $$U(m-1,g,h) = F^{x_1}G^{x_2}F^{x_3}G^{x_4}\ldots F^{x_v} \text{ for } 0 \leq g,h \leq L \quad (64)$$

where $x_j$ are positive integers; and $$\sum_{j=1}^{v} x_j = m - 1.$$

The definition of the conditional probability expresses the fact that among the m−1 intermediate time slots there are some time slots in which a primary packet arrives, represented by the F matrix, and some time slots in which no primary packet arrives, represented by the G matrix. In particular, the conditional probabilities $R(e_j-1,g,h)$ are calculated for 2≦j≦n that the buffer occupancy is h at the end of the time slot before the j-th primary packet arrives given that the buffer occupancy was g at the end of the time slot when the (j−1)-th data packet arrived.

$$R(e_j - 1, g, h) = \begin{cases} (F^{m-1})_{g,h}, & 2 \leq j \leq \left\lfloor \frac{w}{m} \right\rfloor \\ (F^u G^{q-1})_{g,h}, & j = \left\lfloor \frac{w}{m} \right\rfloor + 1, u \geq 1, z \geq 2 \\ (G^{m-1})_{g,h}, & j = \left\lfloor \frac{w}{m} \right\rfloor + 1, u = 0 \\ (G^{m-1})_{g,h}, & \left\lfloor \frac{w}{m} \right\rfloor + 1 < j \leq k \\ \delta_{g,h}, & k+1 \leq j \leq n \end{cases} \quad (65)$$

where
$(F^x)_{g,h}$ = element in row g and column h of matrix F raised to x-th power;
$(G^y)_{g,h}$ = element in row g and column h of matrix G raised to y-th power;
$(F^xG^y)_{g,h}$ = element in row g and column h of the matrix product $F^xG^y$; and $$\delta_{g,h} = \begin{cases} 1, & g = h \\ 0, & g \neq h \end{cases}$$

Because the term $R(e_j-1,g,h)$ is defined only for 2≦j≦n, any set of parameters w, m, q and u that cause j to fall outside this interval represent a condition that does not occur and should be ignored.

Step 2: This step determines the conditional probabilities that an arriving primary packet either is discarded or is not discarded if the level of buffer occupancy is h at the end of the time slot immediately before the time slot in which the primary packet arrives. The conditions under which a packet is not discarded are as follows:

If h≦L−2 or if both h=L−1 and k=L−2, the arriving packet is not discarded.

If h=r=L−1, where r is the buffer occupancy at the end of the time slot in which the primary packet arrives, then the arriving packet is not discarded if either of two conditions are true: no competing packet arrives and a packet is transmitted from buffer with probability $q_Cp_D$, or a competing packet arrives but it arrives after the primary packet and a packet is transmitted from the buffer with probability $$\frac{1}{2}p_Cp_D.$$

If h=L−1 and r=L, where r is the buffer occupancy at the end of the time slot in which the primary packet arrives, then the arriving packet is not discarded if either of two conditions are true: no competing packet arrives and no packet is transmitted from the buffer with probability $q_C q_D$, or a competing packet arrives but it arrives after the primary packet and no packet is transmitted from the buffer with probability $$\frac{1}{2} p_C q_D.$$

If h=L, the arriving primary packet is discarded.

Given the arrival of a primary packet in a current time slot and given a buffer occupancy of h at the end of the previous time slot, the conditional probability that the buffer occupancy is equal to r at the end of the current time slot and that the arriving primary packet is not discarded may be expressed as:

$$E_{h,r} = \begin{cases} F_{h,r}, & h \leq L-2 \\ F_{h,r}, & h = L-1, r \leq L-2 \\ q_C p_D + \frac{1}{2} p_C p_D, & h = r = L-1 \\ q_C q_D + \frac{1}{2} p_C q_D, & h = L-1, r = L \\ 0, & \text{all other } h \text{ and } r \end{cases} \quad \text{for } 0 \leq h, r \leq L \quad (66)$$

Similarly, given the arrival of a primary packet in a current time slot and given a buffer occupancy of h at the end of the previous time slot, the conditional probability that the buffer occupancy is equal to r at the end of the current time slot and that the arriving primary packet is discarded may be expressed as:

$$E_{h,r}^* = \begin{cases} 0, & h \leq L-2 \\ 0, & h = L-1, r \leq L-2 \\ \frac{1}{2} p_C p_D, & h = r = L-1 \\ \frac{1}{2} p_C q_D, & h = L-1, r = L \\ 0, & h = L, r < L-1 \\ p_D, & h = L, r = L-1 \\ q_D, & h = r = L \\ 0, & \text{all other } h \text{ and } r \end{cases} \quad \text{for } 0 \leq h, r \leq L \quad (66)$$

Step 3: This step determines the conditional probability that the buffer occupancy is r at the end of the time slot in which the j-th packet of a set of primary packet arrives and the j-th primary packet is not discarded, given the condition that the buffer occupancy is g at the end of the time slot in which the (j−1)-th primary packet of the set arrives. This conditional probability may be expressed as $$A(g, r, j) = \sum_{h=0}^{L} R(e_i - 1, g, h) E_{h,r} \quad \text{for } 0 \leq g, r \leq L, 2 \leq j \leq n \quad (68)$$

Similarly, the conditional probability that the buffer occupancy is r at the end of the time slot in which the j-th packet of a set of primary packet arrives and the j-th primary packet is discarded, given the condition that the buffer occupancy is g at the end of the time slot in which the (j−1)-th primary packet of the set arrives, may be expressed as:

$$B(g, r, j) = \sum_{h=0}^{L} R(e_i - 1, g, h) E_{h,r}^* \quad \text{for } 0 \leq g, r \leq L, 2 \leq j \leq n \quad (69)$$

Step 4: This step determines the probability M(a,b,d) that b out of the first a packets in a set of primary packets are discarded, where $1 \leq a \leq n$ and $0 \leq b \leq a$, and that the level of buffer occupancy is equal to d at the end of the time slot in which the a-th packet arrives. For a=1 the probability M(a,b,d) can be expressed as a function of the vector S defined above in equations 62 and 63. For a>1, the probability M(a,b,d) can be defined recursively using A(k,g,j) and B(k,g,j) as shown in the following expressions:

$$M(1, 0, 0) = S_0 q_C p_D$$

$$M(1, 0, 1) = S_0 (q_C q_D + p_C p_D) + S_1 q_C p_D$$

$$M(1, 0, d) = S_{d-2} p_C q_D + S_{d-1} (q_C q_D + p_C p_D) + S_d q_C p_D,$$

$$\text{for } 2 \leq d \leq L-2$$

$$M(1, 0, L-1) =$$

$$S_{L-3} p_C q_D + S_{L-2}(q_C q_D + p_C p_D) + S_{L-1}\left(q_C p_D + \frac{1}{2} p_C p_D\right)$$

$$M(1, 0, L) = S_{L-2} p_C q_D + S_{L-1}\left(q_C q_D + \frac{1}{2} p_C q_D\right)$$

$$M(1, 1, d) = 0, \quad \text{for } 0 \leq d \leq L-2$$

$$M(1, 1, L-1) = S_{L-1} \frac{1}{2} p_C p_D + S_L p_D$$

$$M(1, 1, L) = S_{L-1} \frac{1}{2} p_C q_D + S_L q_D$$

$$M(a, 0, d) = \sum_{j=0}^{L} M(a-1, 0, j) \cdot A(j, d, a), \quad \text{for } 2 \leq a \leq n$$

$$M(a, b, d) = \sum_{j=0}^{L} M(a-1, b, j) \cdot A(j, d, a) + \sum_{j=0}^{L} M(a-1, b-1, j) \cdot B(j, d, a),$$

$$\text{for } 2 \leq a \leq n, 1 \leq b \leq a-1$$

$$M(a, a, d) = \sum_{j=0}^{L} M(a-1, a-1, j) \cdot B(j, d, a), \quad \text{for } 2 \leq a \leq n$$

Step 5: This step determines the probability D(a,b,d,v) that v out of k primary data packets are discarded, that b out of the first a EC packets are discarded, and that the buffer occupancy is equal to d at the end of the time slot in which the a-th EC packet arrives, where $1 \leq a \leq n-k$, $0 \leq b \leq a$ and $0 \leq v \leq k$. The probability D(a,b,d,v) for a=1 can be expressed as a function of M(k,v,j), A(j,d,k) and B(j,d,k). For a>1, the probability D(a,b,d,v) can be defined recursively using D(a−1,b,d,v), A(j,d,k) and B(j,d,k) as shown in the following expressions:

$$D(1, 0, d, v) = \sum_{j=0}^{L} M(k, v, j) \cdot A(j, d, k+1)$$

$$D(1, 1, d, v) = \sum_{j=0}^{L} M(k, v, j) \cdot B(j, d, k+1)$$

$$D(a, 0, d, v) = \sum_{j=0}^{L} D(a-1, 0, j, v) \cdot A(j, d, a+k), \text{ for } 2 \le a \le n-k$$

$$D(a, b, d, v) = \sum_{j=0}^{L} D(a-1, b, j, v) \cdot A(j, d, a+k) + \quad \text{for } 2 \le a \le n-k, \; 1 \le b \le a-1$$

$$\sum_{j=0}^{L} D(a-1, b-1, j, v) \cdot B(j, d, a+k),$$

$$D(a, a, d, v) = \sum_{j=0}^{L} D(a-1, a-1, j, v) \cdot B(j, d, a+k), \text{ for } 2 \le a \le n-k$$

The probability $H(v,b)$ that v out of k primary data packets are discarded and b out of $(n-k)$ EC packets are discarded may be expressed as follows:

$$H(v, b) = \sum_{d=0}^{L} D(n-k, b, d, v) \quad \text{for } 0 \le v \le k \tag{70}$$

The average or expected value $E_{rec}$ for the number of data packets that are recovered by the EC process can be expressed as:

$$E_{rec} = \sum_{v=0}^{k} \sum_{b=0}^{n-k} H(v, b) \cdot J(v, b) \tag{71}$$

where $J(v, b) = \begin{cases} k, & v+b \le n-k \\ k-v, & \text{otherwise} \end{cases}$.

F. Approximate Algorithms for CBR-Traffic Model

Algorithms that calculate only an approximate value for $E_{rec}$ usually are not needed for Bernoulli-traffic models because the exact calculation of $E_{rec}$ shown in equation 48 requires computing equation 42, equation 43 for k=L−1, and equation 44, which can be implemented with a computational complexity of O(1), and the application of equation 46, which has a computational complexity of O(nk). The overall computational complexity of the algorithm to calculate $E_{rec}$ is O(nk). These complexity figures assume that all needed binomial coefficients are pre-computed and stored for subsequent use. The calculation of $E_{rec}$ requires less than 1 msec. for L=400 using an implementation written in the C programming language and executed by a computer with a 3.4 GHz Pentium® microprocessor available from Intel Corporation, Santa Clara, Calif. This is fast enough to meet the real-time requirements of many applications.

Unfortunately, an algorithm that calculates an approximate value for $E_{rec}$ is needed for the CBR-traffic model because the computational complexity of the exact algorithm described above is very high.

1. Complexity of Exact Algorithm

Equation 71 derived by the five-step algorithm described above is referred to here as an exact algorithm because it may be used to calculate the expected value $E_{rec}$ without approximation. Step 1 performs m·k matrix multiplications and then calculates the singular value decomposition of a (L+1)×(L+1) matrix. These operations have a computational complexity of $O(mkL^3)$. The computational complexity of the operations needed to perform Steps 2 and 3 are negligible. The operations in Step 4 to calculate the probability M(a,b,d) have a computational complexity of $O(k^2L)$. The operations in Step 5 to calculate the probability D(a,b,d,v) have a computational complexity of $O((n-k)^2kL^2)$. The overall complexity of the five-step algorithm is about $O((mkL^3+k^2L+((n-k)^2kL^2))$. In practical implementations, however, the size of the buffer L is likely to be one or two orders of magnitude larger than the values n,k; therefore, the overall complexity of the algorithm is about $O(mkL^3)$.

The entries in Table I show the amount of time needed to calculate $E_{rec}$ for different buffer sizes using an exemplary implementation of the five-step algorithm written in the C programming language and executed by a computer with a 3.4 GHz Pentium microprocessor. The singular value decomposition in Step 1 was implemented by the svdcmp routine described in Press et al., "Numerical Recipes in C++: The Art of Scientific Computing," 2nd ed., Cambridge University Press, 1992.

TABLE I

| Buffer size L | Time in msec. |
|---|---|
| 400 | 1558 |
| 300 | 623 |
| 200 | 155 |
| 100 | 15 |
| 50 | <1 |

In typical multimedia wireless networks, the packet processing device 10 can be implemented by many commercially available IEEE 802.11 based wireless Access Points (AP), which typically have a buffer storage capacity for 300 or more packets. The entries in Table I indicate at least 623 msec. is needed by the exemplary implementation mentioned above to calculate the expected value $E_{rec}$ for such an AP. Unfortunately, the calculations must be performed in an amount of time that is at least one order of magnitude smaller to allow real-time adaptation of the EC parameters (n,k) for many multimedia applications. The derivation of a lower complexity algorithm is described below that can calculate an approximate value for $E_{rec}$ in much less time.

2. Collapsed-State Model

The purpose of the five-step algorithm described above is to determine the EC parameters (n,k) that minimize the loss of information after EC recovery. This algorithm needs to be calculated only when packet losses occur because one or more packets were discarded by the packet processing device 10 due to buffer overflow. Buffer overflow will occur when the level of buffer occupancy is at or near L and the cumulative arrival rate of both competing and primary packets at the packet processing device 10 is higher than the rate at which the device transmits packets from the buffer. In other words, entries $S_k$ of the steady state vector S are zero or are nearly zero for all but a few values of k that are very close to L.

Figure 5:
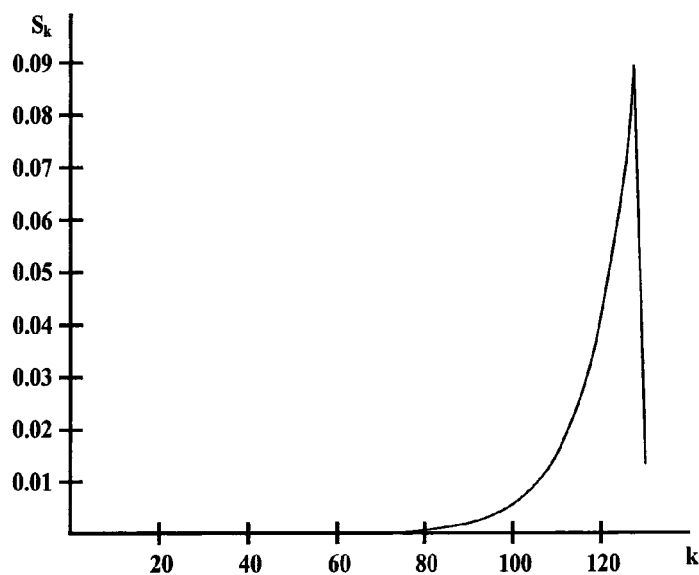
FIGS. 5-7 are graphical illustrations of steady-state probabilities as a function of the state of buffer occupancy.
Figure 6:
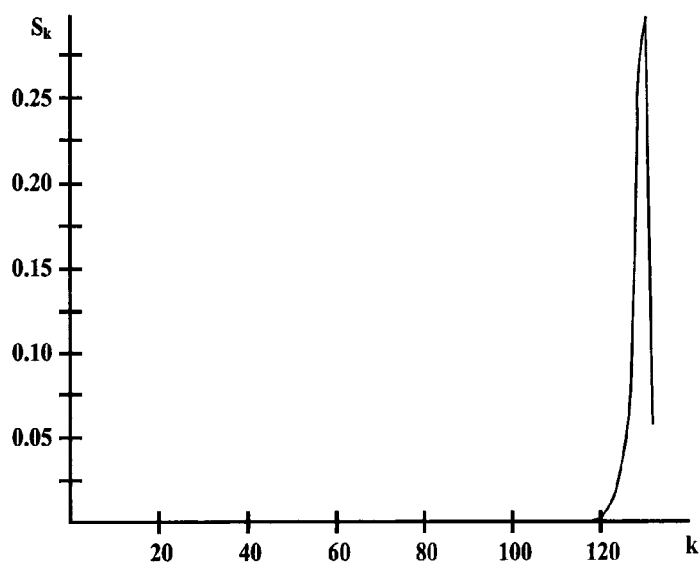
Figure 7:
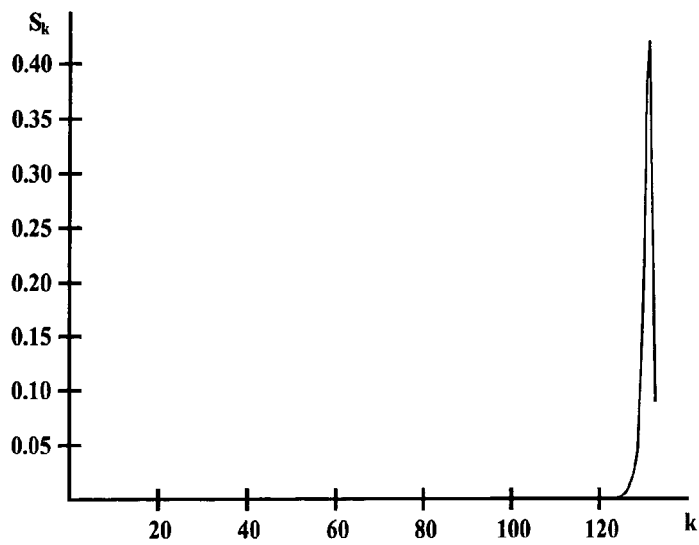

Numerical experiments confirm these expectations. The graphs in FIGS. 5 to 7 show the distributions of the steady state probability $S_k$ for different competing traffic rates $p_C$. In all three examples, m=4, n=6, k=5 and $p_D$=0.8. The model will achieve a state of equilibrium when the sum of the arrival rates $p_A+p_C$ is equal to $p_D$, which occurs when $p_C$=0.5. For the example shown in FIG. 5, $p_C$=0.52, which is slightly above the equilibrium rate. As shown in the figure, the steady state probabilities $S_k$ rise sharply with increasing k; however, steady state probabilities larger than 0.01 can be found only for values of k>95. Even if $p_C$ is increased so that the accumulative arrival rate $p_A+p_C$ is larger than the transmission rate $p_D$, such as $p_C$=0.6 and $p_C$=0.66 as shown in FIGS. 6 and 7, respectively, the steady state probabilities $S_k$ are still zero or close to zeros unless k is very close to L.

This behavior can be used to develop a good approximate algorithm. Any state of the traffic model that has a steady state probability $S_k$ of zero or close to zero has no significant impact on system behavior because the system is essentially never in this state. In the examples shown in FIGS. 5 to 7, the majority of all states with $S_k \approx 0$ have little or no impact on the dynamics of the steady state model. As a result, these states can be ignored in the calculation of the steady state vector S without changing the result of the calculation significantly, and can be ignored without significantly changing the calculated value of $E_{rec}$.

Based on this observation, an approximate algorithm can be derived that calculates $E_{rec}$ only for the steady states k where $S_k > \epsilon$ and $\epsilon$ is a small threshold value. This approximate algorithm uses a collapsed-state vector C in which all states k for $S_k > \epsilon$ are represented by individual vector elements $C_k = S_{k+L_0}$ and all other states k for $S_k \leq \epsilon$ are collapsed into a single state $C_0$. It is assumed that $S_k \leq \epsilon$ for $k \leq L_0$, where $L_0$ is a threshold value of buffer occupancy. As a result, the collapsed-state vector C has only $L-L_0+1$ entries $C_k$, for $0 \leq k \leq L-L_0$.

The steady state vector S with L+1 entries can be represented approximately by the collapsed-state vector C with only $L-L_0+1$ entries by redefining the transition matrix shown in equation 3 with the value $L-L_0$ substituted for L. The transition probability between the states $C_a$ and $C_b$, for $0 \leq a,b \leq L-L_0$, is defined as $T_{a+L_0,b+L_0}$. This transition matrix describes exactly the dynamics of buffer occupancy if a, b>0 but it describes only approximately the dynamics of buffer occupancy if either a=0 or b=0. This approximation should not have any significant effect on the accuracy of the calculations for $C_k$, where $1 \leq k \leq L-L_0$, if the threshold $\epsilon$ is chosen small enough because the collapsed state $C_0$ is assumed to occur very infrequently with a probability of only $\epsilon L_0$. Specifically, it is expected that the absolute difference $|C_k - C_{k+L_0}|$ is very small for $1 \leq k \leq L-L_0$.

The collapsed state vector C may be calculated by applying singular value decomposition to either equation 62 or 63 and then normalizing the result using equation 52 with the vector C substituted for the vector $\pi$ as described above. After calculating the vector C, an approximate value for $E_{rec}$ can be calculated from equation 71 by using the vector C rather than the vector S. The examples shown in FIGS. 5 to 7 suggest the value $L_0$ can be expected to be near the value L, which reduces computational complexity from $O(mkL^3)$ to $O(mk(L-L_0)^3)$. By substituting the value $L-L_0$ for the buffer size L in Table I, it may be seen that the execution times of the exemplary implementation can be reduced by one or more orders of magnitude when $L_0$ is sufficiently close to L. The value for $L_0$ can be chosen to allow an implementation of the approximate algorithm to satisfy the real-time requirements of many multimedia applications.

The value $L_0$ must be determined before the approximate algorithm can be used. Numerical simulations have shown that $L_0$ can be chosen to be as small as $L_0$=10 without significantly degrading the accuracy of the approximate algorithm whenever $p_A+p_C > p_D+\mu$, where $\mu$=0.1. A set of values $L_0$ that are appropriate for different values of $\mu$ can be pre-calculated for use with the approximate algorithm by using the exact value for $E_{rec}$ as calculated by equation 71 to determine what values of $L_0$ allow the approximate algorithm to estimate $E_{rec}$ with acceptable levels of accuracy.

This collapsed-state approximation technique may be used to obtain an algorithm with reduced computational complexity for essentially any traffic model.

G. Applications

The techniques described above may be used to derive algorithms to implement a variety of applications in a packet communication system.

One application uses the algorithms described above to calculate the loss probability of a primary data packet after EC recovery given the parameters $p_A$, $p_C$, $p_D$, L and the EC parameters (n,k).

One application determines adapts the EC parameters (n,k) to minimize the loss of primary data packets after EC recovery. One way this may be done is to first determine all pairs of parameter values (n,k) that are feasible for the communication system under consideration. Certain constraints imposed on the system such as communication path bandwidth and maximum allowable delay also impose constraints on the choice of the EC parameters (n,k). Limitations on bandwidth impose limitations on the ratio $\phi$ and limitations on delay impose limitations on the parameter n. The set of all feasible parameter values (n,k) can be determined by establishing the maximum acceptable amounts of delay and bandwidth and then identifying all pairs of the EC parameters (n,k) that satisfy these requirements. The algorithms derived above can be applied to the parameters $p_A$, $p_C$, $p_D$, L and all or a subset of the feasible EC parameter values to calculate the associated loss probability. The EC parameter values (n,k) that achieve the lowest loss probability can be selected as an optimum set of parameters.

Another application determines an optimal rate for the data source 2 to send primary packets. In this application, values for the EC parameters (n,k) are chosen and the algorithms derived above are applied to different packet arrival rates $p_A$ to calculate the associated loss probability. In many cases, practical considerations impose limits on the rates that can be considered. The rate that achieves the lowest loss probability can be used to set the optimum sending rate for the data source.

Alternatively, the derived algorithms can be applied to a range of values for both the EC parameters (n,k) and the packet arrival rates to determine the settings that achieve the lowest loss probability.

Yet another application calculates $p_C$, which is the probability of arrival of a competing packet, given the parameters $p_A$, $p_D$, L, the EC parameters (n,k), and the rate of losing primary data packets after EC recovery. The applications described above assume that values for the parameters $p_A$, $p_C$, $p_D$ and L are known. If the value for $p_C$ is not known, the value of $p_C$ can be obtained from the parameters $p_A$, $p_D$, $p_{loss}$ and L if no EC protection is provided, and it can be obtained from the parameters $p_A$, n, k, $p_D$, $E_{loss}$ and L if EC protection is provided. An iterative process that calculates $p_C$ may be implemented in the data source 2, for example. This process can obtain the values for $p_A$, n and k from the data source 2 and can obtain the values for $p_D$ and $P_{loss}$ or $E_{loss}$ from the receiver 20. The value for L is often known a priori but can be obtained from the packet processing device 10 if it is not otherwise known. The way in which the iteration may be performed is described in the following paragraphs. The value of $p_C$ that is calculated by this process can be used in other applications such as an input parameter to the algorithms described above.

If no EC protection is provided, the value of $p_C$ for a Bernoulli-traffic system can be determined from relations defined by equation 2 and equations 42 to 44. For a CBR-traffic system, the value can be determined from relations defined by equation 2 and the technique described above in connection with equation 53. For either type of system, the relations defined by these equations establish a monotonic one-to-one mapping between $p_C$ and $P_{loss}$. Using this mapping property, $p_C$ may be determined by an iterative binary-chop search that converges to the value of $p_C$.

If EC protection is provided, the value of $p_C$ for a Bernoulli-traffic system can be determined from relations defined by equations 2 and 48. For a CBR-traffic system, the value can be determined from relations defined by equations 2 and 71. For either type of system, the relations defined by these equations establish a monotonic one-to-one mapping between $p_C$ and $E_{rec}$. Using this mapping property, $p_C$ may be determined by an iterative binary-chop search that converges to the value of $p_C$.

In many implementations, the feasible choices of n and k are limited by bandwidth and delay requirements. The algorithms described in the preceding paragraphs can be used to find the EC parameters (n,k) among all feasible choices of n and k that minimize the loss probability after EC recovery: The value for $p_C$ is determined as just described and then a search over all feasible values of n and k is performed to find the optimum values.

H. Implementation

Referring to FIG. 1, the communication paths 3, 5, 11, 21 and 22 may be implemented by essentially any technology and media such as electrical signals through metallic wires, optical signals through optical fiber, and radio-frequency (RF) emissions through space. The present invention may be used advantageously in communication systems like that suggested in FIG. 1 in which the communication path 11 is a wireless RF path and all other communication paths are electrical or optical paths.

The functions required to practice various aspects of the present invention can be performed by components that are implemented in a wide variety of ways including discrete logic components, integrated circuits, one or more ASICs and/or program-controlled processors. The manner in which these components are implemented is not important to the present invention.

Software implementations of the present invention may be conveyed by a variety of machine readable media such as baseband or modulated communication paths throughout the spectrum including from supersonic to ultraviolet frequencies, or storage media that convey information using essentially any recording technology including magnetic tape, cards or disk, optical cards or disc, and detectable markings on media including paper.

The invention claimed is:

1. A method for controlling a provision of packets in a communication system comprising:
    a first data source that provides a source signal conveying information arranged in a set of packets comprising a first number of data packets and a second number of error-correction packets,
    a packet processing device that receives the source signal, stores information for at least some of the packets in the set of packets in a buffer having a buffer size, and transmits an output signal comprising packets of information of which at least some was stored in the buffer, wherein information for at least some of the packets in the set of packets is omitted from the output signal due to losses caused by the buffer being full, and
    a receiver that receives at least some of the packets in the output signal and applies an error correction process to these received packets to recover corrupted or missing information,
wherein the method comprises:
    (a) receiving one or more signals conveying parameters representing the buffer size, the first and second numbers, an arrival probability that a packet from the first data source is received by the packet processing device during an interval of time, a transmission probability that the packet processing device successfully transmits a packet during the interval of time when the buffer is not empty, and an interference probability that a competing packet from any competing data source is received by the packet processing device during the interval of time;
    (b) deriving from the parameters a measure of loss probability that information in a data packet is lost and not recovered by the error correction process, wherein the measure of the loss probability is derived by a process that accounts for losses caused by the buffer being full and wherein either:
        (1) the process has a computational complexity that is independent of the buffer size and the loss probability has a value from zero to one for all values of the arrival probability, the transmission probability and the interference probability from zero to one, or
        (2) the process represents a solution of a model in which packets in the source signal naive arrive at the packet processing device according to a deterministic process; and (c) adapting the first number or the second number in response to the measure of the loss probability.

2. The method of claim 1 wherein the process represents the solution of the model in which packets in the source signal arrive at the processing device according to a deterministic process and packets arrive at a constant rate, and wherein the arrival probability is proportional to the constant rate.

3. The method of claim 1 wherein:
the arrival probability conforms to a first probability distribution of packets in the source signal arriving at the processing device according to a Bernoulli process, and
the process derives the measure of the loss probability without approximation and has a computational complexity proportional to a product of the second number and a third number, wherein the third number is equal to a sum of the first number and the second number.

4. The method of claim 1 wherein the process derives the measure of the loss probability with approximation by excluding those states of buffer occupancy that have a steady-state probability below a threshold.

5. The method of claim 4 wherein the process has a computational complexity proportional to a product of a fourth number raised to the third power, the first number and a fifth number, wherein the forth number represents a count of those states of buffer occupancy having a steady-state probability above the threshold and wherein the fifth number is inversely proportional to the arrival probability.

6. The method of claim 1 that derives the interference probability by applying a second process to information representing the buffer size, the first and second numbers, the arrival probability, the transmission probability and an initial loss probability.

7. The method of claim 6 wherein the second process derives the measure of the interference probability with approximation by excluding those states of buffer occupancy that have a steady-state probability below a threshold.

8. The method of claim 1 wherein:
the arrival probability conforms to a first probability distribution of packets in the source signal arriving at the processing device according to a deterministic process, and
the interference probability conforms to a second probability distribution of a competing packet arriving at the processing device according to a probabilistic process.

9. The method of claim 8 wherein the process derives the measure of the loss probability with approximation by excluding those states of buffer occupancy that have a steady-state probability below a threshold.

10. The method of claim 9 wherein the process has a computational complexity proportional to a product of a fourth number raised to the third power, the first number and a fifth number, wherein the forth number represents a count or those states of buffer occupancy having a steady-state probability above the threshold and wherein the fifth number is inversely proportional to the arrival probability.

11. A method for controlling a provision of packets in a communication system comprising:
a first data source that provides a source signal conveying information arragned in a set of packets,
a packet processing device that receives the source signal, stores information for at least some of the packets in the set of packets in a buffer having a buffer size, and transmits an output signal comprising packets of information of which at least some was stored in the buffer, wherein information for at least some of the packets in the set of packets is omitted from the output signal due to losses caused by the buffer being full, and
a receiver that receives at least same of the packets in the output signal, wherein the method comprises:
(a) receiving one or more signals conveying parameters representing the buffer size,
an interference probability that a competing packet from any competing data source is received by the packet processing device during the interval of time, and
a transmission probability that the packet processing device successfully transmits a packet during the interval of time when the buffer is not empty;
(b) deriving from the parameters a respective loss probability for each of a plurality of arrival probabilities, wherein each respective loss probability represents a probability that information in a data packet is lost and is derived by a process that accounts for losses caused by the buffer being full, wherein each arrival probability represents a probability that a packet from the first data source is received by the packet processing device during an interval of time, and wherein either:
(1) the process has a computational complexity that is independent of the buffer size and the loss probability has a value from zero to one for all values of the arrival probability, the transmission probability and the interference probability from zero to one, or
(2) the process represents a solution of a model in which packets in the source signal arrive at the packet processing device according to a deterministic process;
(c) selecting the arrival probability from which a minimum loss probability in the plurality of loss probabilities is derived; and
(d) adapting operation of the first data source such that the packet processing device receives packets in a manner that more closely reflects the selected arrival probability.

12. The method of claim 11 wherein the process represents the solution of the model in which packets in the source signal arrive at the processing device according to a deterministic process and packets arrive at a constant rate, and wherein the arrival probability is proportional to the constant rate.

13. The method of claim 11 wherein:
the arrival probability conforms to a first probability distribution of packets in the source signal arriving at the processing device according to a Bernoulli process, and
the process derives the measure of the loss probability without approximation and has a computational complexity proportional to a product of the second number and a third number, wherein the third number is equal to a sum of the first number and the second number.

14. The method of claim 11 wherein the process derives the measure of the loss probability with approximation by excluding those states of buffer occupancy that have a steady-state probability below a threshold.

15. The method of claim 14 wherein the process has a computational complexity proportional to a product of a fourth number raised to the third power, the first number and a fifth number, wherein the forth number represents a count of those states of buffer occupancy having a steady-state probability above the threshold and wherein the fifth number is inversely proportional to the arrival probability.

16. The method of claim 11 wherein:
the arrival probability conforms to a first probability distribution of packets in the source signal arriving at the processing device according to a deterministic process, and
the interference probability conforms to a second probability distribution of a competing packet arriving at the processing device according to a probabilistic process.

17. The method of claim 16 wherein the process derives the measure of the loss probability with approximation by excluding those states of buffer occupancy that have a steady-state probability below a threshold.

18. The method of claim 17 wherein the process has a computational complexity proportional to a product of a fourth number raised to the third power, the first number and a fifth number, wherein the forth number represents a count of those states of buffer occupancy having a steady-state probability above the threshold and wherein the fifth number is inversely proportional to the arrival probability.

19. A communication system comprising:
a first data source that provides a source signal conveying information arranged in a set of packets comprising a first number of data packets and a second number of error-correction packets,
a packet processing device that receives the source signal, stores information for at least some of the packets in the set of packets in a buffer having a buffer size, and transmits an output signal comprising packets of information of which at least some was stored in the buffer, wherein information for at least some of the packets in the set of packets is omitted from the output signal due to losses caused by the buffer being full, and
a receiver that receives at least some of the packets in the output signal and applies an error correction process to these received packets to recover corrupted or missing information,
wherein one or more of the first data source, the packet processing device and the receiver have circuitry that is adapted to:
(a) receive one or more signals conveying parameters representing the buffer size, the first and second numbers, an arrival probability that a packet from the first data source is received by the packet processing device during an interval of time, a transmission probability that the packet processing device successfully transmits a packet during the interval of time when the buffer is not empty, and an interference probability that a competing packet from any competing data source is received by the packet processing device during the interval of time:
(b) derive from the parameters a measure of loss probability that information in a data packet is lost and not recovered by the error correction process, wherein the measure of die loss probability is derived by a process that accounts for losses caused by the buffer being full and wherein either:
(1) the process has a computational complexity that is independent of the buffer size and the loss probability has a value from zero to one for all values of the arrival probability, the transmission probability and the interference probability from zero to one, or
(2) the process represents a solution of a model in which packets in the source signal arrive at the packet processing device according to a deterministic process; and
(a) adapt the first number or the second number in response to the measure of the loss probability.

20. A communication system comprising:
a first data source that provides a source signal conveying information arragned in a set of packets,
a packet processing device that receives the source signal, stores information for at least some of the packets in the set of packets in a buffer having a buffer size, and transmits an output signal comprising packets of information of which at least some was stored in the buffer, wherein information for at least some of the packets in the set of packets is omitted from the output signal due to losses caused by the buffer being full, and
a receiver that receives at least some of the packets in the output signal,
wherein one or more of the first data source, the packet processing device and the receiver have circuitry that is adapted to:
(a) receive one or more signals conveying parameters representing
the buffer size,
an interference probability that a competing packet from any competing data source is received by the packet processing device during the interval of time, and
a transmission probability that the packet processing device successfully transmits a packet during the interval of time when the buffer is not empty;
(b) derive from the parameters a respective loss probability for each of a plurality of arrival probabilities, wherein each respective loss probability represents a probability that information in a data packet is lost and is derived by a process that account for losses caused by the buffer being full, wherein each arrival probability represents a probability that a packet from the first data source is received by the packet processing device during an interval of time, and wherein either:
(1) the process has a computational complexity that is independent of the buffer size and the loss probability has a value from zero to one for all values of the arrival probability, the transmission probability and the interference probability from zero to one, or
(2) the process represents a solution of a model in which packets in the source signal arrive at the packet processing device according to a deterministic process;
(c) select the arrival probability from which a minimum loss probability in the plurality of loss probabilities is derived; and
(d) adapt operation of the first data source such that the packet processing device receives packets in a manner that more closely reflects the selected arrival probability.

21. A storage medium recording a program of instructions that is executable by a device to perform a method for setting error correction parameters in a communication system comprising:
a first data source that provides a source signal conveying information arranged in a set of packets comprising a first number of data packets and a second number of error-correction packets,
a packet processing device that receives the source signal, stores information for at least some of the packets in the set of packers in a buffer having a buffer size, and transmits an output signal comprising packets of information of which at least some was stored in the buffer, wherein information for at least some of the packets in the set of packets is omitted from the output signal due to losses caused by the buffer being full, and
a receiver that receives at least some of the packets in the output signal and applies an error correction process to these received packets to recover corrupted or missing information,
wherein the method comprises:
(a) receiving one or more signals conveying parameters representing the buffer size, the first and second numbers, an arrival probability that a packet from the first data source is received by the packet processing device during an interval of time, a transmission probability that the packet processing device successfully transmits a packet during the interval of time when the buffer is not empty, and an interference probability that a competing packet from any competing data source is received by the packet processing device during the interval of time;

(b) deriving front the parameters a measure of loss probability that information in a data packet is lost and not recovered by the error correction process, wherein the measure of the loss probability is derived by a process that accounts for losses caused by the buffer being full and wherein either:

(1) the process has a computational complexity that is independent of the buffer size and the loss probability has a value from zero to one for all values of the arrival probability, the transmission probability and the interference probability from zero to one, or (2) the process represents a solution of a model in which packets in the source signal arrive at the packet processing device according to a deterministic process; and (c) adapting the first number a the second number in response to the measure of the loss probability.

22. A storage medium recording a program of instructions that is executable by a device to perform a method for setting error correction parameters in a communication system comprising:

a first data source that provides a source signal conveying information arragned in a set of packets, a packet processing device that receives the source signal, stores information for at least some of the packets in the set of packets in a buffer having a buffer size, and transmits an output signal comprising packets of information of which at least some was stored in the buffer, wherein information for at least some of the packets in the set of packets is omitted from the output signal due to losses caused by the buffer being full, and a receiver that receives at least some of the packets in the output signal, wherein the method comprises:

(a) receiving one or more signals conveying parameters representing
the buffer size,
an interference probability that a competing packer from any competing data source is received by the packet processing device during the interval of time, and
a transmission probability that the packet processing device successfully transmits a packet during the interval of time when the buffer is not empty;

(b) deriving from the parameters a respective loss probability for each of a plurality of arrival probabilities, wherein each respective loss probability represents a probability that information in a data packet is lost and is derived by a process that accounts for losses caused by the buffer being full, wherein each arrival probability represents a probability that a packet from the first data source is received by the packet processing device during an interval of time, and wherein either:

(1) the process has a computational complexity that is independent of the buffer size and the loss probability has a value from zero to one for all values of the arrival probability, the transmission probability and the interference probability from zero to one, or (2) the process represents a solution of a model in which packets in the source signal arrive at the packet processing device according to a deterministic process;

(c) selecting the arrival probability from which a minimum loss probability in the plurality of loss probabilities is derived; and (d) adapting operation or the first data source such that the packet processing device receives packets in a manner that more closely reflects die selected arrival probability.

* * * * *